(12) United States Patent
Jung et al.

(10) Patent No.: US 10,900,883 B2
(45) Date of Patent: Jan. 26, 2021

(54) MOLD TEST APPARATUS AND METHOD

(71) Applicant: Samsung Electronics Co., Ltd., Suwon-si (KR)

(72) Inventors: Jung Lae Jung, Hwaseong-si (KR); Tea Geon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 269 days.

(21) Appl. No.: 16/049,099

(22) Filed: Jul. 30, 2018

(65) Prior Publication Data
US 2019/0257734 A1 Aug. 22, 2019

(30) Foreign Application Priority Data

Feb. 21, 2018 (KR) .......................... 10-2018-0020643

(51) Int. Cl.
*G01N 15/08* (2006.01)
*B29C 33/70* (2006.01)
*H01L 21/56* (2006.01)

(52) U.S. Cl.
CPC ......... *G01N 15/0826* (2013.01); *B29C 33/70* (2013.01); *H01L 21/565* (2013.01); *B29C 2033/705* (2013.01); *H01L 2924/181* (2013.01)

(58) Field of Classification Search
CPC .................. H01L 2924/181; H01L 21/565
See application file for complete search history.

(56) References Cited

U.S. PATENT DOCUMENTS

| 2,889,933 | A | * | 6/1959 | Brundage | B01D 29/52 210/541 |
| 5,672,211 | A | * | 9/1997 | Mai | C23C 14/28 118/726 |
| 7,445,969 | B2 | * | 11/2008 | Kuratomi | H01L 21/566 257/E23.125 |
| 7,905,131 | B2 | * | 3/2011 | Watanabe | B29C 45/77 73/40 |
| 8,236,621 | B2 | * | 8/2012 | Sugai | B29C 43/18 257/E21.504 |

(Continued)

FOREIGN PATENT DOCUMENTS

JP 2009-248510 A 10/2009
JP 5622441 B2 10/2014

(Continued)

OTHER PUBLICATIONS

Machine Translation of JP-2009248510 which originally published on Oct. 29, 2009. (Year: 2009).*

*Primary Examiner* — David A. Rogers
(74) *Attorney, Agent, or Firm* — Sughrue Mion, PLLC

(57) ABSTRACT

A mold test apparatus includes a mold support plate having a top surface on which a mold is mounted, wherein the mold support plate includes a plurality of test suction pipes communicating with paths in the mold, vacuum pipes each having one end connected to one of the plurality of test suction pipes, a pump connected to the other end of the pipe, and at least one pressure sensor configured to measure a pressure of the vacuum pipe, wherein the paths communicate with adsorption holes provided in a top surface of the mold, and wherein the at least one pressure sensor includes a determining unit configured to determine whether the adsorption holes are clogged by using the measured pressure.

20 Claims, 10 Drawing Sheets

(56) References Cited

U.S. PATENT DOCUMENTS

| | | | |
|---|---|---|---|
| 10,131,077 B2* | 11/2018 | Bae | B29C 45/14819 |
| 10,252,507 B2* | 4/2019 | Hosseini | B32B 38/0008 |
| 2001/0008775 A1* | 7/2001 | Yamamoto | H01L 21/565 |
| | | | 438/106 |
| 2005/0070047 A1* | 3/2005 | Kuratomi | H01L 21/566 |
| | | | 438/107 |
| 2007/0210468 A1* | 9/2007 | Tsuchida | B29C 33/72 |
| | | | 264/39 |
| 2008/0057626 A1* | 3/2008 | Kuratomi | H01L 24/97 |
| | | | 438/117 |
| 2008/0280114 A1* | 11/2008 | Tang | B44F 1/06 |
| | | | 428/210 |
| 2009/0068302 A1* | 3/2009 | Nakamura | B29C 43/18 |
| | | | 425/147 |
| 2010/0233857 A1* | 9/2010 | Kuratomi | H01L 21/565 |
| | | | 438/117 |
| 2011/0127689 A1* | 6/2011 | Kim | H01L 21/566 |
| | | | 264/101 |
| 2011/0233821 A1* | 9/2011 | Bandoh | B29C 48/08 |
| | | | 264/272.11 |
| 2012/0061880 A1* | 3/2012 | Han | B29C 45/0046 |
| | | | 264/443 |
| 2013/0181037 A1* | 7/2013 | Nagai | H05K 13/0465 |
| | | | 228/103 |
| 2015/0034984 A1* | 2/2015 | Shin | H01L 33/005 |
| | | | 257/98 |
| 2015/0140229 A1* | 5/2015 | Hosseini | C23C 14/28 |
| | | | 427/527 |
| 2015/0364456 A1 | 12/2015 | Yu et al. | |
| 2016/0079178 A1* | 3/2016 | Kim | H01L 23/3121 |
| | | | 257/773 |
| 2016/0084638 A1* | 3/2016 | Yamauchi | H01L 24/81 |
| | | | 356/614 |
| 2016/0126213 A1* | 5/2016 | Celia, Jr. | H01L 24/75 |
| | | | 228/101 |
| 2016/0141186 A1* | 5/2016 | Suzuki | H01L 24/98 |
| | | | 438/106 |
| 2016/0284576 A1* | 9/2016 | Onishi | B29C 43/021 |
| 2017/0189995 A1* | 7/2017 | Zenou | H05K 3/18 |
| 2017/0217062 A1* | 8/2017 | Bae | H01L 21/565 |
| 2017/0282527 A1* | 10/2017 | Akiba | H01L 21/78 |
| 2018/0350727 A1* | 12/2018 | Schindler | H01L 23/49589 |

FOREIGN PATENT DOCUMENTS

| | | | |
|---|---|---|---|
| KR | 10-2004-0065364 A | | 7/2004 |
| KR | 10-0793274 B1 | | 1/2008 |
| KR | 10-2009-0053300 A | | 5/2009 |
| KR | 10-0925962 B1 | | 11/2009 |
| KR | 20090126415 A | * | 12/2009 |
| KR | 10-1725598 B1 | | 4/2017 |

* cited by examiner

MOLD TEST APPARATUS AND METHOD

CROSS-REFERENCE TO RELATED APPLICATION

This U.S. non-provisional patent application claims priority under 35 U.S.C. § 119 to and the benefit of Korean Patent Application No. 10-2018-0020643, filed on Feb. 21, 2018, in the Korean Intellectual Property Office (KIPO), the disclosure of which is incorporated herein by reference in its entirety.

FIELD

The present inventive concept relates to a mold test apparatus including test suction pipes for testing film adsorption holes of a mold.

BACKGROUND

In a semiconductor manufacturing process, a molding process is a process in which a device is entirely surrounded using a thermosetting resin including an epoxy resin and the thermosetting resin changes to a liquid by using heat and pressure so as to encompass a semiconductor chip. A molding process is performed such that an upper mold and a lower mold are coupled to form a sealed space in which molding is performed and a molding resin is injected into the sealed space. In order to prevent contamination of the mold that occurs while a thermosetting resin changes to a liquid due to high-temperature heat, a release film is attached to the mold. The release film is adsorbed onto the mold through fine vacuum holes. When the vacuum holes are clogged, the release film is not adsorbed onto the mold and is detached therefrom so that the flow of the molding resin may be disturbed. Since several fine vacuum holes are installed in the mold, it takes time and cost to check which vacuum holes are clogged. In order to solve this problem, a technique for predetermining whether vacuum holes of a mold are clogged is necessary, before a molding process is performed.

SUMMARY OF THE INVENTION

The present inventive concept is directed to providing a mold test apparatus including a test suction port connected to an internal path that communicates with vacuum holes of the mold.

In addition, the present inventive concept is directed to providing a mold test apparatus, whereby pressure against a test suction port is measured to determine how many vacuum holes are clogged in which portion of the mold in comparison with a previously input value.

Further, the present inventive concept is directed to providing a method of testing a mold, whereby whether vacuum holes of the mold are clogged is determined and the number of clogged vacuum holes is determined.

A mold test apparatus according to an exemplary embodiment of the present inventive concept includes a mold support plate having a top surface on which a mold is mounted, wherein the mold support plate includes a plurality of test suction pipes communicating with paths in the mold, vacuum pipes each having one end connected to one of the plurality of test suction pipes, a pump connected to the other end of the pipe, and at least one pressure sensor configured to measure a pressure of the vacuum pipe, wherein the paths communicate with adsorption holes provided in a top surface of the mold, and wherein the at least one pressure sensor may include a determining unit configured to determine whether the adsorption holes are clogged by using the measured pressure.

A method of testing a mold according to an exemplary embodiment of the present inventive concept includes mounting a mold on a top surface of a mold support plate so that a plurality of test suction pipes disposed on the mold support plate and paths in the mold are connected to each other, fixing the mounted mold, and measuring, by a pressure sensor, pressures of vacuum pipes configured to connect the plurality of test suction pipes to a pump, wherein the paths communicate with film adsorption holes provided in a top surface of the mold.

A mold test apparatus according to an exemplary embodiment of the present inventive concept includes a mold support plate having a top surface on which a mold is mounted, wherein the mold support plate includes a plurality of test suction pipes communicating with paths in the mold, vacuum pipes each having one end connected to one of the plurality of test suction pipes, a pump connected to the other end of the pipe, and at least one pressure sensor configured to measure a pressure of the vacuum pipe, wherein the mold includes a plurality of regions having adsorption holes, wherein the paths may communicate with adsorption holes disposed in one region of the plurality of regions, and wherein the adsorption holes may include film adsorption holes.

DETAILED DESCRIPTION OF EXEMPLARY EMBODIMENTS

Figure 1:
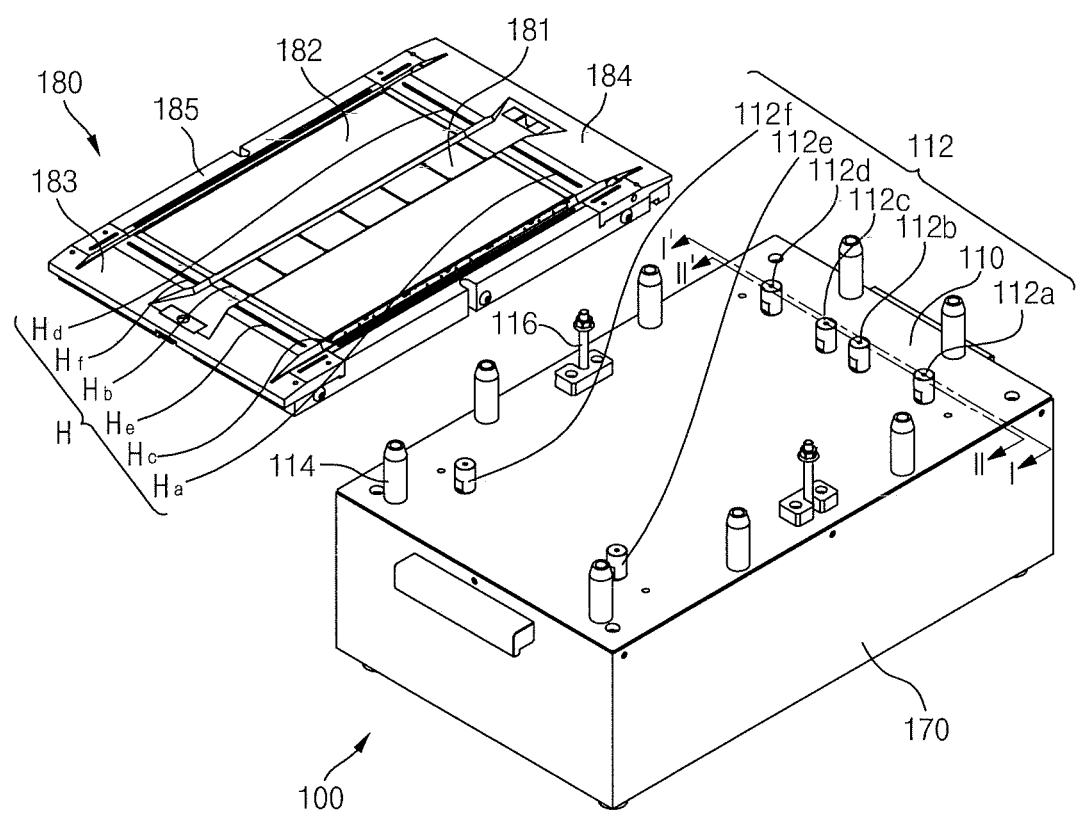
FIG. 1 is a perspective view of a mold test apparatus and a mold according to an exemplary embodiment of the present inventive concept.
Figure 2:
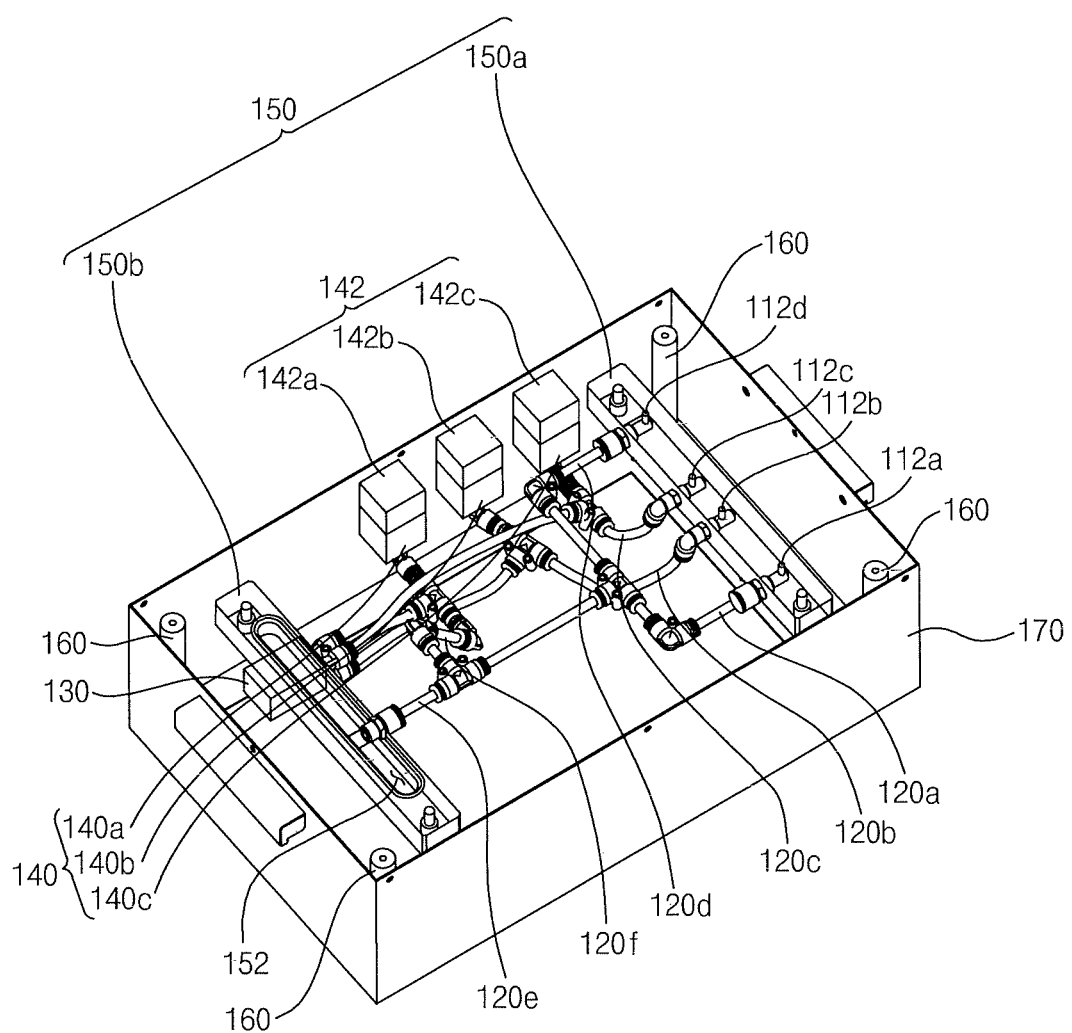
FIG. 2 is an interior perspective view of the mod test apparatus and the mold according to the exemplary embodiment of the present inventive concept.

FIG. 1 is a perspective view of a mold test apparatus 100 and a mold 180 according to an exemplary embodiment of the present inventive concept. FIG. 2 is an interior perspective view of the mold test apparatus 100 according to the exemplary embodiment of the present inventive concept.

Referring to FIGS. 1 and 2, the mold test apparatus 100 may include a mold support plate 110, vacuum pipes 120, a pump 130, pressure sensors 140, fixing members 150, support bases 160, and a housing 170. The mold test apparatus 100 may have a box shape or a table shape that supports the mold support plate 110 by using the support bases 160. However, the embodiment of the present inventive concept is not limited thereto. The mold test apparatus 100 may determine whether film adsorption holes H in the mold 180 are clogged. The film adsorption holes H may be vacuum holes through which an object is adsorbed due to a negative pressure so that an object such as a film or vacuum may be attached to the mold 180. For example, the mold test apparatus 100 may determine whether film adsorption holes H for attaching a release film or substrate adsorption holes for attaching a substrate are clogged.

The mold support plate 110 may be disposed on a top surface of the mold test apparatus 100. The mold support plate 110 may include test suction pipes 112, a positioning pin 114, and a fixing pin 116. The mold 180 may be mounted on the mold support plate 110. The mold 180 may be mounted in a reverse state so as to check whether film adsorption holes H are clogged. The mold 180 may be a mold for molding a semiconductor device. The mold 180 may also be a mold for forming a light-emitting device package.

The test suction pipes 112 may be provided on the mold support plate 110. In FIG. 1, six test suction pipes 112 are provided. However, the number of test suction pipes 112 may vary according to a mold to be tested. Each of the test suction pipes 112 may have a cylindrical shape or square pillar shape. However, the embodiment of the present inventive concept is not limited thereto. The test suction pipes 112 may include test suction pipes 112a, 112b, 112c, 112d, 112e, and 112f shown in FIG. 1.

Figure 4:
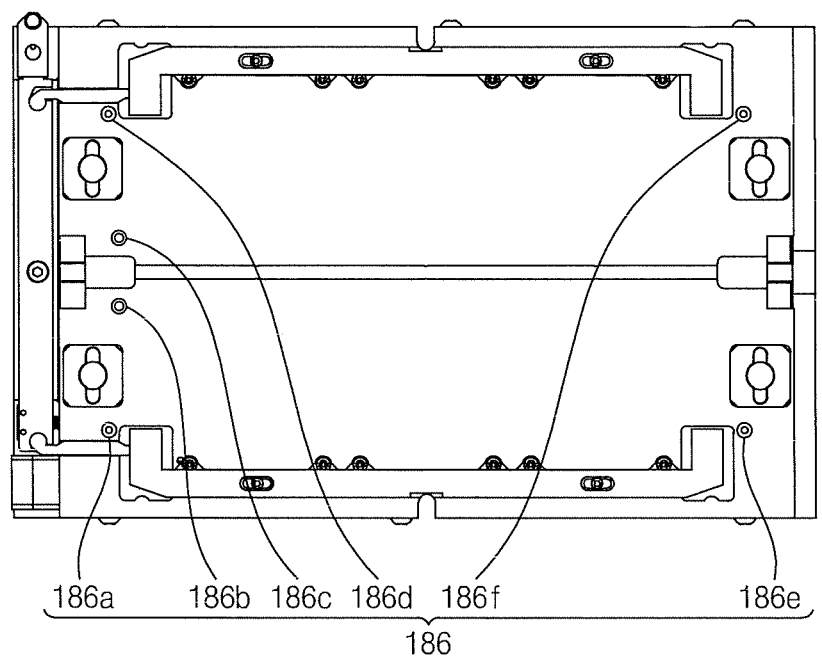
FIG. 4 is a bottom plan view of the mold according to the exemplary embodiment of the present inventive concept.

One end of individual test suction pipes 112 may be in close contact with individual suction ports 186 provided in a bottom surface of the mold 180. FIG. 4 is a bottom plan view of the mold 180 according to the exemplary embodiment of the present inventive concept. In FIG. 4, suction ports 186a, 186b, 186c, 186d, 186e, and 186f are located at the bottom surface of the mold 180. The test suction pipes 112a, 112b, 112c, 112d, 112e, and 112f may be in close contact with the suction ports 186a, 186b, 186c, 186d, 186e, and 186f, respectively.

The other end of the individual test suction pipes 112 may be connected to individual vacuum pipes 120 inside the mold test apparatus 100. Alternatively, the other end of one of the test suction pipes 112 may be connected to one of the vacuum pipes 120 via a space 152 inside a fixing member 150b. The test suction pipes 112 may allow the film adsorption holes H of the mold 180 and the vacuum pipes 120 inside the mold test apparatus 100 to communicate with each other.

Referring back to FIGS. 1 and 2, the positioning pin 114 may be disposed on the mold support plate 110. The positioning pin 114 may guide a mounting position of the mold 180 so that the mold 180 may be located at a position suitable for a test.

The fixing pin 116 may be disposed on the mold support plate 110. The fixing pin 116 may be inserted into a groove formed in a side surface of the mold 180. A screw may be disposed on one end of the fixing pin 116 to fix the mold 180.

One end of individual vacuum pipes 120 may be connected to the pump 130, and the other end of individual vacuum pipes 120 may be connected to individual test suction pipes 112. Alternatively, the other end of one of the vacuum pipes 120 may be connected to one of the test suction pipes 112 via the space 152 inside fixing member 150b. One of the vacuum pipes 120 may be connected to one of the test suction pipes 112, and some of the vacuum pipes 120, having one end connected to the test suction pipes 112, may be connected to each other and connected to the pump 130. The vacuum pipes 120 include vacuum pipes 120a, 120b, 120c, 120d, 120e, and 120f shown in FIG. 2.

The pump 130 may be disposed inside the mold test apparatus 100. The pump 130 may be connected to the test suction pipes 112 via one of the vacuum pipes 120. The pump 130 may remove air in the test suction pipes 112 via the vacuum pipes 120. For example, the pump 130 may be a vacuum pump for generating a negative pressure. A plurality of vacuum pipes 120 may be connected to the pump 130, but the pump 130 may apply suction to only one of the plurality of vacuum pipes 120.

The pressure sensors 140 may be disposed at a side surface of the mold test apparatus 100. The pressure sensors 140 may be connected to a side surface of the vacuum pipes 120 connected to the pump 130. The pressure sensors 140 may measure a pressure of the vacuum pipes 120. For example, the pressure sensors 140 may include a pressure indicator, and the pressure indicator may indicate a pressure in an analog or digital manner.

The pressure sensors 140 may include determining units 142. The determining units 142 may compare a measured pressure value with a previously input pressure value and may generate a signal when the measured pressure is out of a predetermined range. For example, when portions of the film adsorption holes H of the mold 180 are clogged and a high pressure is measured, the determining units 142 may generate an abnormal signal in the pressure indicator. Alternatively, even when the mold 180 is not suitably positioned or the test suction pipes 112 are not in close contact with the suction ports 186 of the mold 180, the determining units 142 may generate an abnormal signal. A worker may determine whether the film adsorption holes H of the mold 180 that correspond to signal-generating portions are clogged. When pressure values according to the number of film adsorption holes H clogged in the mold 180 are known, clogged portions of the film adsorption holes H and the number of clogged film adsorption holes H may be checked due to the pressure values measured by the pressure sensors 140.

Fixing members 150 may be disposed on a bottom surface of the mold support plate 110. One end of one or more of the test suction pipes 112 and one end of one or more of the vacuum pipes 120 may be connected to each other within fixing member 150a. The fixing member 150a may fix a connection point between one end of one or more of the vacuum pipes 120 and one or more of the test suction pipes 112 in the mold test apparatus 100. Fixing member 150b may include a space 152 therein, and the space 152 may allow a plurality of test suction pipes 112 and one of the vacuum pipes 120 to communicate with each other.

The support bases 160 may be installed to support the mold support plate 110 at four corners. The support bases 160 may have a cylindrical or square pillar shape. The housing 170 may surround the support bases 160 and the mold support plate 110.

FIG. 2 illustrates a connection relationship between each of the test suction pipes 112a, 112b, 112c, 112d, 112e, and 112f and pressure sensors 140a, 140b, and 140c. Referring to FIG. 2, in the mold test apparatus 100 according to the exemplary embodiment of the present inventive concept, the test suction pipe 112b and the pressure sensor 140b may be connected to each other. The test suction pipe 112c may be connected to the pressure sensor 140c. The vacuum pipes 120a, 120d and 120e connecting the test suction pipes 112a, 112d, 112e and 112f may be connected to each other, and the vacuum pipe 120f may be connected to the pressure sensor 140a. With this structure, the pressure sensor 140a may measure the pressure of the vacuum pipes 120a, 120d, 120e and 120f connected to the test suction pipes 112a, 112d, 112e and 112f, and the pressure sensor 140b may measure the pressure of the vacuum pipe 120b connected to the test suction pipe 112b, and the pressure sensor 140c may measure the pressure of the vacuum pipe 120c connected to the test suction pipe 112c. When the pressure is measured, the pump 130 may apply suction to only one of the vacuum pipes 120 connected to the pump 130.

For example, the mold test apparatus 100 may be used to test a semiconductor package molding mold. The molding mold may be a mold used for an injection molding process, a compression molding process, or a molded underfill (MUF) process. In the case of compression molding, a semiconductor device may be attached to an upper mold, and a release film may be attached to a lower mold. In the case of injection molding, the semiconductor device may be seated on the lower mold, and the release film may be attached to the upper mold. The mold 180 illustrated in FIG. 1 indicates the upper mold. However, the embodiment of the present inventive concept is not limited thereto, and the lower mold may also be tested.

Figure 3:
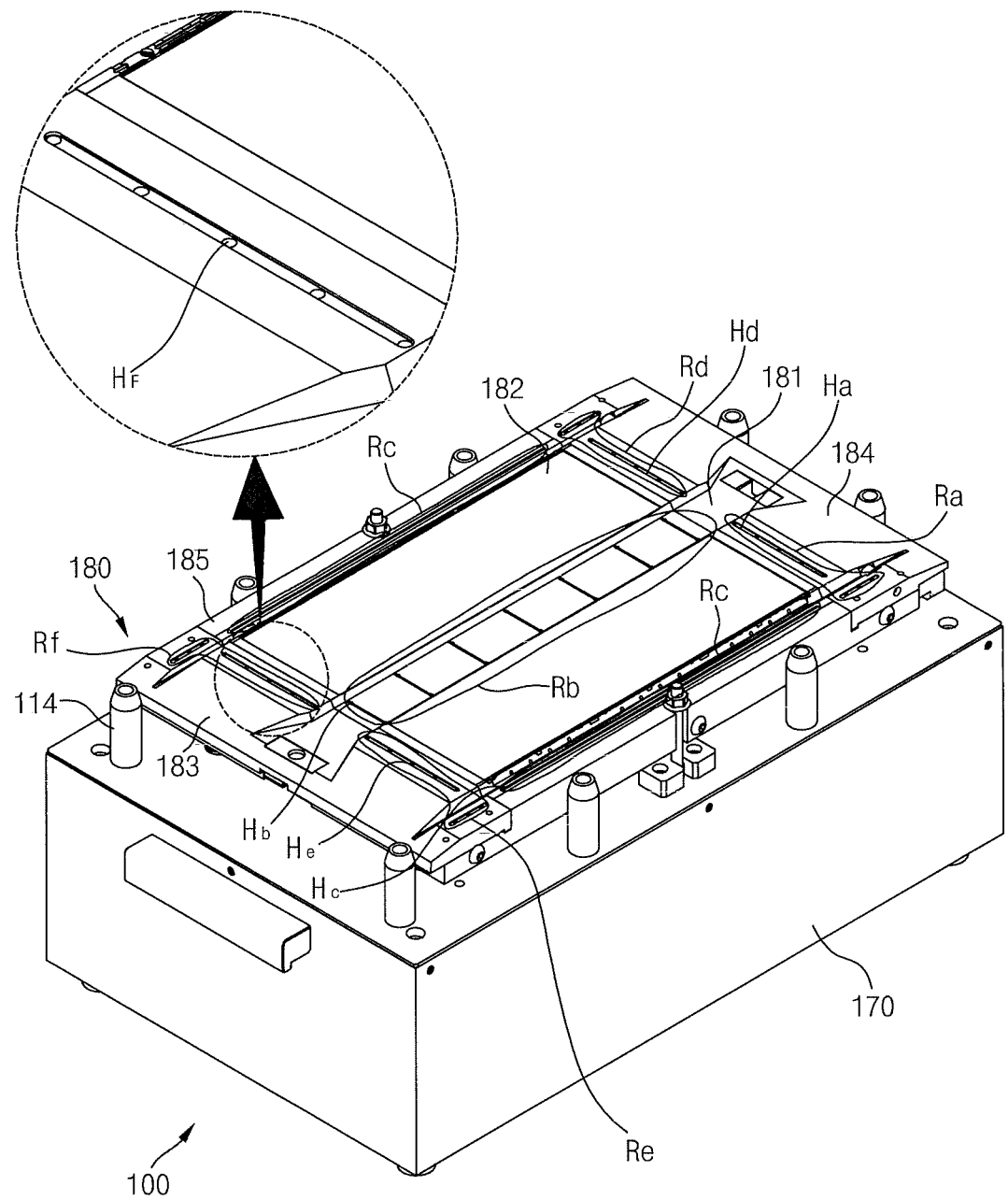
FIG. 3 is a perspective view illustrating a state in which the mold is mounted on the mold test apparatus illustrated in FIG. 1.

FIG. 3 is a perspective view of a state in which the mold 180 is mounted on the mold test apparatus 100 shown in FIG. 1. FIG. 4 is a bottom plan view of the mold 180 according to the exemplary embodiment of the present inventive concept.

Referring to FIGS. 3 and 4, the mold 180 may include a curl block 181, cavity blocks 182, a front block 183, a rear block 184, and side blocks 185 on a top surface of the mold 180. In addition, the mold 180 may further include film adsorption holes H in a top surface thereof and may include suction ports 186 in a bottom surface thereof. Here, the top surface refers to an upper surface of the mold 180 shown in FIG. 1, and the bottom surface refers to a surface opposite the top surface. The film adsorption holes H may communicate with the suction ports 186 through a path 187 in the mold 180 that will be described below.

The curl block 181 may be located in the center of the mold 180 between the cavity blocks 182. The curl block 181 may include a plurality of ports from which a molding resin is supplied. Although not shown, a plunger for injecting the molding resin may be disposed in the mold 180. The plunger may be disposed in the lower mold, and when the mold is sealed, the molding resin may be injected from the lower mold to the upper mold.

The cavity blocks 182 may be disposed on both sides of the curl block 181. A molding material injected from the curl block 181 may flow into the cavity blocks 182, and the cavity blocks 182 may provide a space in which molding of an object is performed.

The front block 183 and the rear block 184 may be positioned in front of and behind the cavity blocks 182. The front block 183 and the rear block 184 may fix the cavity blocks 182. In addition, the side blocks 185 may be located on side surfaces of the cavity blocks 182, that is, outside the mold 180. The side blocks 185 may fix the cavity blocks 182.

In a molding process, a release film (not shown) may be attached to the top surface of the mold 180 so that the molding material may not be attached to the mold 180. The release film may be attached to cover all or a part of the curl block 181, the cavity blocks 182, the front block 183, the rear block 184, and the side blocks 185. The release film may have the form of a sheet.

The release film may have a structure in which an adhesive layer is formed on both outer sides of a base layer and an outermost layer is formed on the outer side of the adhesive layer. The outermost layer may include a 4-methyl-1-pentene-based polymer. The base layer may include polycarbonate resin, polyester resin, and polyamide resin. The adhesive layer may include a 4-methyl-1-pentene-based polymer modified to have a polar group.

The release film may be attached by a method such as vacuum adsorption so that the release film may be maintained in a state of being attached to the mold 180 during the molding process. When adsorption of the release film is insufficient or degraded, the release film may block a cavity inside the mold 180 or interfere with injection of the molding resin. When the molding resin is not suitably injected, voids or swelling may be formed inside a package.

Film adsorption holes H may be provided to adsorb the release film. The film adsorption holes H may be connected to the suction ports 186 provided in the bottom surface of the mold 180 through the path 187. Through the film adsorption holes H, the release film may be attached to the mold 180 by vacuum adsorption. The size of each of the film adsorption holes H may be in a range of 0.1 to 1 mm. When the size of each of the film adsorption holes H is equal to or greater than 1 mm, an adsorbed portion of the release film may be suctioned into the mold 180, and when the size of the film adsorption hole H is equal to or less than 0.1 mm, the release film may not be suitably adsorbed.

Referring to FIGS. 3 and 4, regions Ra, Rb, Rc, Rd, Re, and Rf are shown on the top surface of the mold 180. The regions Ra, Rb, Rc, Rd, Re, and Rf may communicate with the suction ports 186a, 186b, 186c, 186d, 186e, and 186f disposed in the bottom surface of the mold 180, respectively.

Figure 5:
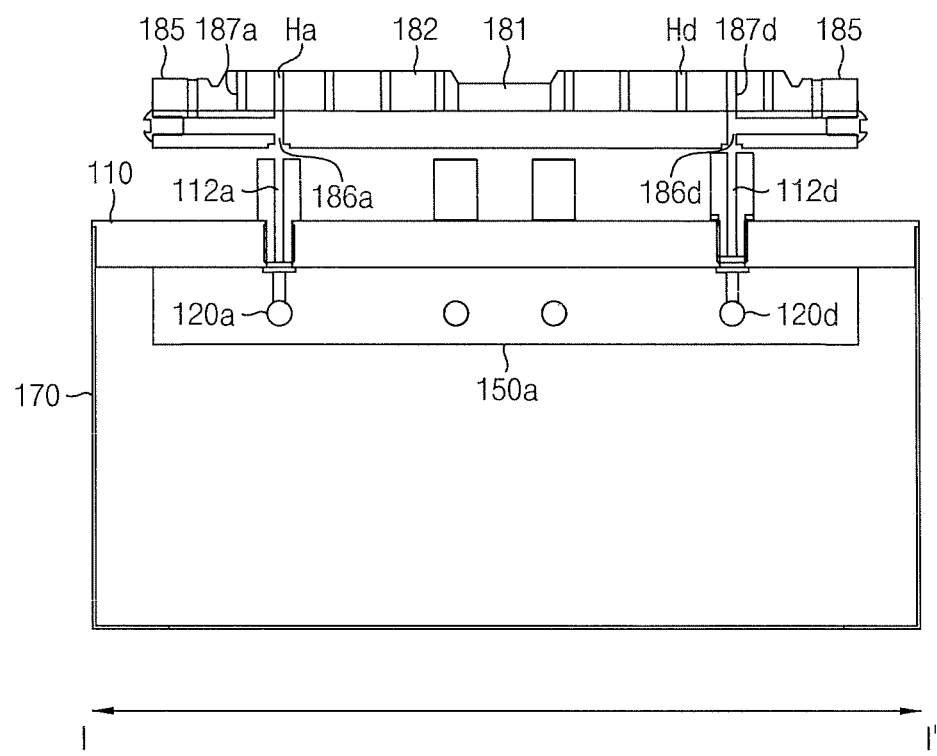
FIG. 5 is a cross-sectional view taken along line I-I' of the mold test apparatus and the mold illustrated in FIG. 1.
Figure 6:
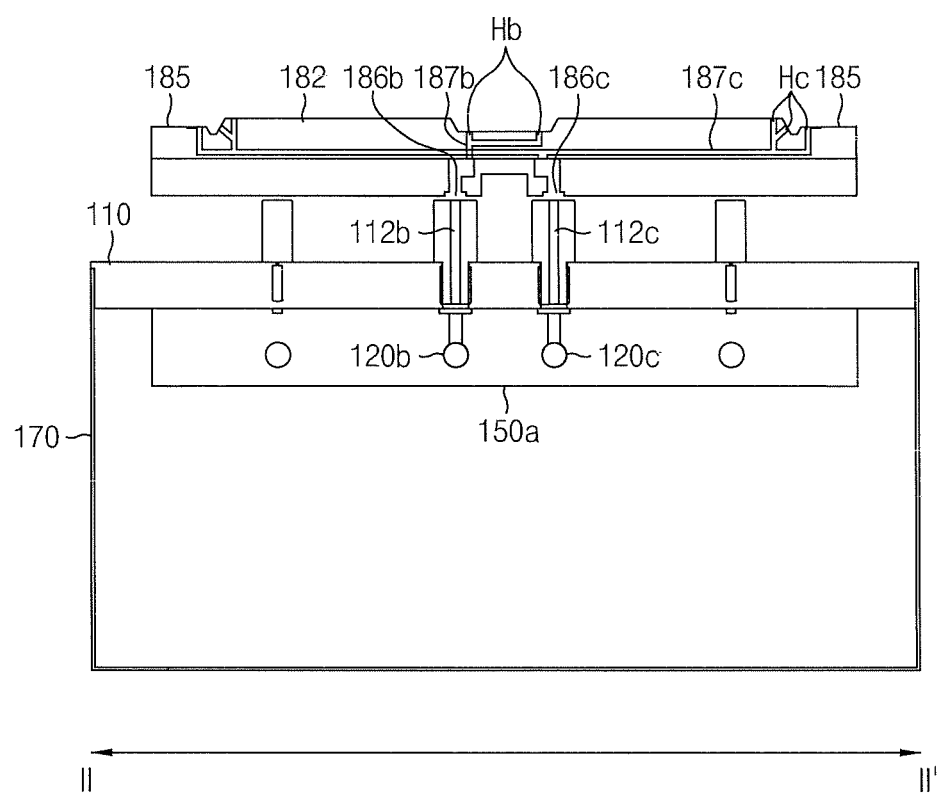
FIG. 6 is a cross-sectional view taken along line II-II' of the mold test apparatus and the mold illustrated in FIG. 1.

FIG. 5 is a cross-sectional view taken along line I-I' of the mold test apparatus 100 and the mold 180 shown in FIG. 1. FIG. 6 is a cross-sectional view taken along line II-II' of the mold test apparatus 100 and the mold 180 shown in FIG. 1.

A connection relationship between the film adsorption holes H and the test suction pipes 112 of the mold 180 will be described with reference to FIGS. 2 to 6. Referring to FIG. 3, the regions Ra, Rb, Rc, Rd, Re, and Rf are shown on the top surface of the mold 180. Film adsorption holes Ha, Hb, Hc, Hd, He and Hf are disposed in the regions Ra, Rb, Rc, Rd, Re and Rf, respectively.

Referring to FIG. 5, when the film adsorption holes Ha and Hd disposed in the regions Ra and Rd may respectively communicate with the suction ports 186a and 186d disposed on the bottom surface of the mold 180 by paths 187a and 187d. For example, six film adsorption holes Ha may communicate with the suction port 186a by the path 187a provided inside the mold 180. Referring to FIGS. 2 and 5, the suction ports 186a and 186d may communicate with the vacuum pipes 120a and 120d through the test suction pipes 112a and 112d.

Each of the film adsorption holes He and Hf disposed in each of the regions Re and Rf may communicate with a corresponding one of the suction ports 186e and 186f disposed in the bottom surface of the mold 180. Referring to FIG. 2, the suction ports 186e and 186f may communicate with the space 152 inside the fixing member 150 through the test suction pipes 112e and 112f. The space 152 may be connected to the vacuum pipe 120e, and the vacuum pipe 120e may be connected to the vacuum pipes 120a and 120d. The vacuum pipes 120a, 120d, and 120e may be connected to the pump 130 while being joined to the vacuum pipe 120f. The pressure sensor 140a may measure a pressure of the vacuum pipe 120f. The pressure sensor 140a may determine whether the film adsorption holes Ha, Hb, He, and Hf disposed in the top surface of the mold 180 are clogged by using pressure measurement.

Referring to FIG. 6, the film adsorption holes Hb disposed in the region Rb may communicate with the suction port 186*b* provided in the bottom surface of the mold 180. For example, the film adsorption holes Hb may communicate with the suction port 186*b* through a path 187*b*. The suction port 186*b* may be in close contact with a front end of the test suction pipe 112*b*. The test suction pipe 112*b* may be connected to the pump 130 by the vacuum pipe 120*b*. The pressure sensor 140*b* may measure a pressure of the vacuum pipe 120*b*. The pressure sensor 140*b* may determine whether the film adsorption holes Hb disposed in the top surface of the mold 180 are clogged by using pressure measurement.

Similarly, the film adsorption holes He disposed in the region Re may communicate with the suction port 186*c* provided in the bottom surface of the mold 180. For example, the film adsorption holes Hc may communicate with the suction port 186*e* through a path 187*c*. The suction port 186*c* may be in close contact with a front end of the test suction pipe 112*c*. The test suction pipe 112*c* may be connected to the pump 130 by the vacuum pipe 120*c*. The pressure sensor 140*c* may measure a pressure of the vacuum pipe 120*c*. The pressure sensor 140*c* may determine whether the film adsorption holes Hc provided in the top surface of the mold 180 are clogged by using pressure measurement.

The pressure sensors 140*a*, 140*b*, and 140*c* may further include determining units 142*a*, 142*b*, and 142*c*, respectively. Each of the determining units 142*a*, 142*b*, and 142*c* may determine whether the film adsorption holes H are clogged by using pressure measurement, or may determine the number of the film adsorption holes H that are clogged. For example, the determining unit 142*b* may compare the measured pressure value with a previously input pressure value to determine the number of clogged film adsorption holes Hb.

Figure 7:
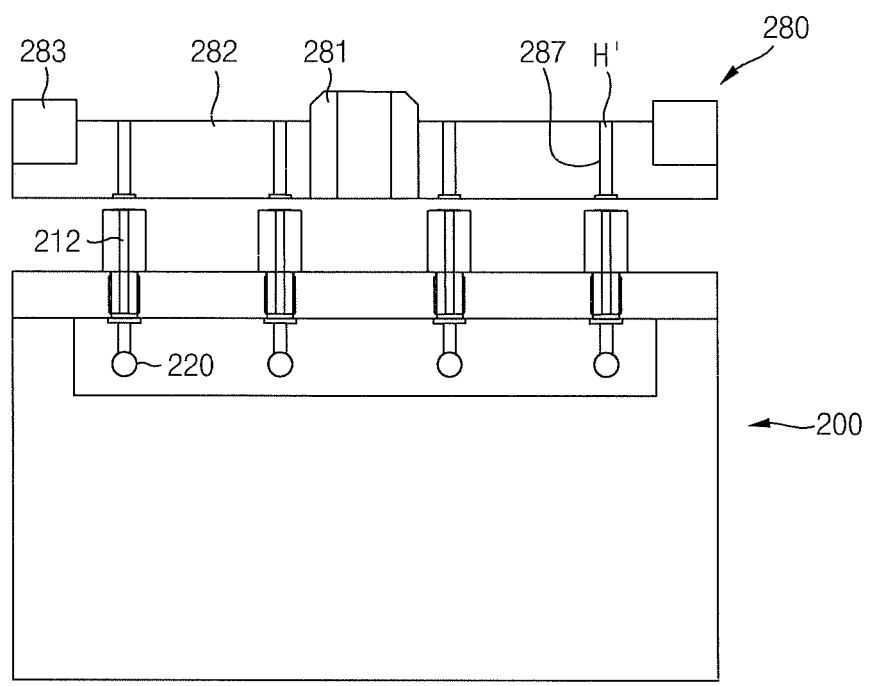
FIG. 7 is a cross-sectional view of a mold test apparatus and a mold according to an exemplary embodiment of the present inventive concept.

FIG. 7 is a cross-sectional view of a mold test apparatus 200 and a mold 280 according to an exemplary embodiment of the present inventive concept.

Referring to FIG. 7, the mold 280 may be a lower mold for molding a semiconductor package. The mold 280 may include a port block 281, cavity blocks 282, and side blocks 283. The port block 281 may include a plurality of ports (not shown) for supplying a molding resin. A plunger (not shown) for supplying the molding resin may be disposed in the ports. The cavity blocks 282 may be disposed on both sides of the port block 281. An object to be molded may be seated on the cavity blocks 282. The cavity blocks 282 may provide a space for molding the object. The side blocks 283 may be disposed on both outer sides of the cavity blocks 282.

Substrate adsorption holes H' may be disposed in the cavity blocks 282 to adsorb and fix a substrate (not shown) during the molding process. In FIG. 7, four substrate adsorption holes H' are shown. However, the embodiment of the present inventive concept is not limited thereto. The mold test apparatus 200 may include a test suction pipe 212 communicating with a path 287, and the path 287 may be connected to the substrate adsorption holes H'. The test suction pipe 212 may be connected to a pipe 220, and the pipe 220 may be connected to the pump 130.

In an exemplary embodiment, the mold test apparatus 200 may include a test suction pipe 212 capable of determining clogging of the substrate adsorption holes H' formed in the lower mold. In an exemplary embodiment, the mold test apparatus 200 may further include test suction pipes 112 capable of determining clogging of the film adsorption holes H formed in the upper mold. In the above embodiment, the mold test apparatus 200 may test not only the upper mold but also the lower mold. This is also applied to the case where the substrate adsorption holes H' are formed in the upper mold and the film adsorption holes H are formed in the lower mold.

The vacuum holes in the present inventive concept may mean the film adsorption holes H or the substrate adsorption holes H'.

Figure 8:
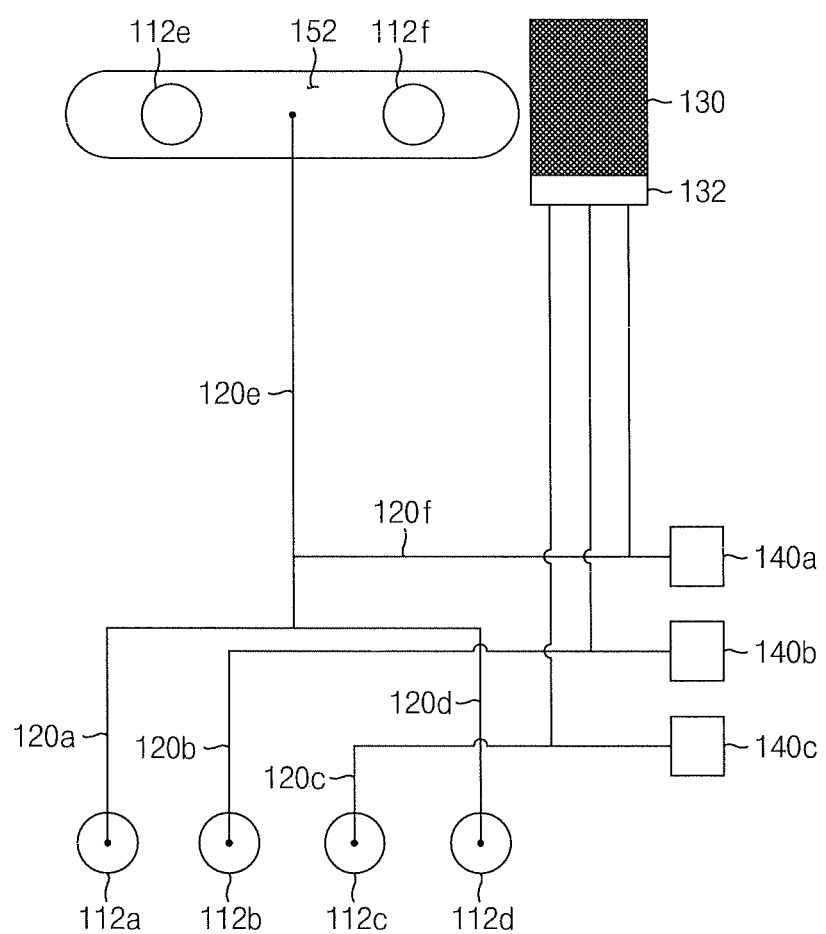
FIG. 8 is a schematic view of a pipe circuit according to an exemplary embodiment of the present inventive concept.
Figure 9:
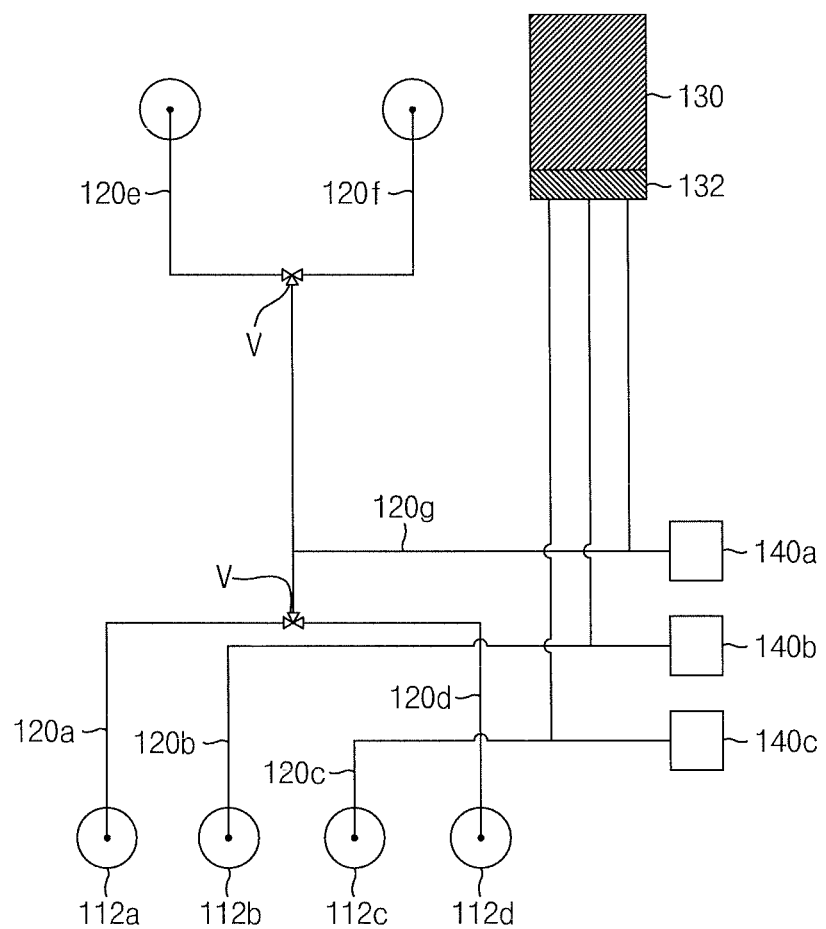
FIG. 9 is a schematic view of a pipe circuit according to an exemplary embodiment of the present inventive concept.
Figure 10:
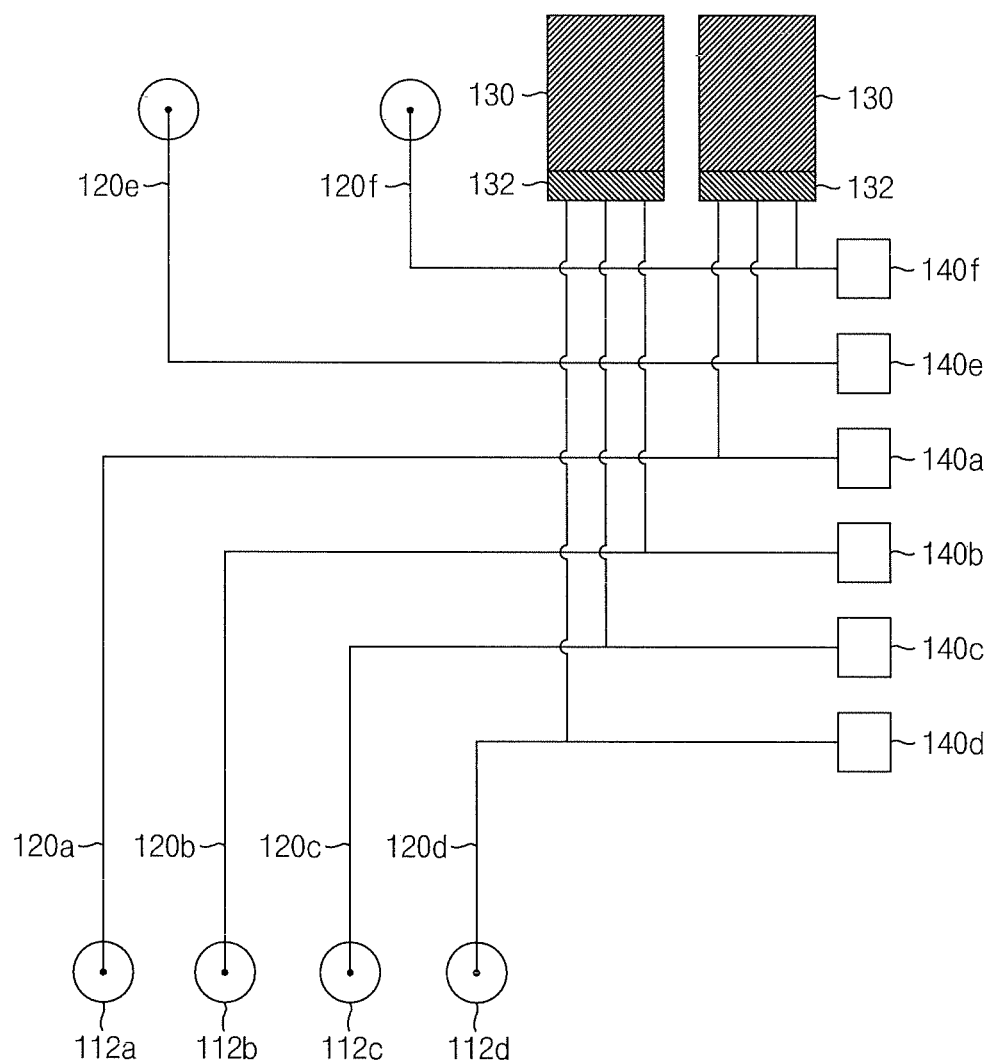
FIG. 10 is a schematic view of a pipe circuit according to an exemplary embodiment of the present inventive concept.

FIG. 8 is a schematic view for describing a circuit of the vacuum pipes 120 according to an exemplary embodiment of the present inventive concept. FIGS. 9 to 10 are schematic views of a circuit of the vacuum pipes 120 according to an exemplary embodiment of the present inventive concept.

Referring to FIG. 8, the arrangement of the test suction pipes 112, the vacuum pipes 120 and the pump 130 shown in FIG. 2 is schematically shown. The pump 130 may include a switch 132. The switch 132 may control opening or closing of the vacuum pipes 120 so that vacuum suction can be performed only on one of the vacuum pipes 120 connected to the pump 130.

In the arrangement, pressure measurement is possible for each vacuum pipe 120. For example, pressure measurement is possible for the vacuum pipe 120*b*, the vacuum pipe 120*c*, and the vacuum pipe 120*f*.

Referring to FIG. 9, a valve V is disposed at one end of the vacuum pipes 120*a* and 120*d*. The valve V is also disposed at the vacuum pipes 120*e* and 120*f*. The valve V may be a three-way valve. The three-way valve may have two input lines and one output line and may be adjusted to open only one of the two input lines. A vacuum pipe 120*g* connected to the valves V may be connected to the pump 130.

Unlike the case of FIG. 8, in the arrangement of FIG. 9, opening or closing of the vacuum pipes 120*a*, 120*d*, 120*e* and 120*f* may be controlled by the valve V. Pressure measurement is possible for only one of the six test suction pipes 112 by adjusting the valve V. Because pressure measurement is possible for only one of the test suction pipes 112, it may be determined whether the film adsorption holes H are clogged only for any one region of the regions Ra, Rb, Rc, Rd, Re, and Rf of the top surface of the mold. In this way, clogging of the film adsorption holes H may be determined within a smaller range.

Referring to FIG. 10, two pumps 130 may be disposed in the mold test apparatus 200. The vacuum pipes 120 connected to the pumps 130 may be connected to correspond to only one of the test suction pipes 112. In this arrangement, the clogging of the film adsorption holes H may be determined only for any one region of the top surface of the mold, as in the case of FIG. 9, without using the valve V.

According to exemplary embodiments of the present inventive concept, whether vacuum holes of a mold are clogged can be determined in advance.

According to the exemplary embodiments of the present inventive concept, clogged portions of vacuum holes and the number of clogged vacuum holes can be checked so that defective portions can be precisely checked. Further, a process of dividing and assembling the mold unnecessarily can be omitted so that time for a mold repairing work can be effectively reduced and the occurrence of secondary defects in the assembling process can be prevented.

While the embodiments of present inventive concept have been described with reference to the accompanying drawings, it will be understood by those of ordinary skill in the art that various changes in form and details may be made therein without changing the technical spirit or essential features of the present inventive concept. Therefore, the above-described embodiments should be considered in a descriptive sense only and not for purposes of limitation.

What is claimed is:

1. A mold test apparatus comprising:
a mold support plate comprising a top surface on which a mold is mounted, wherein the mold support plate comprises a plurality of test suction pipes communicating with paths in the mold and protruding upward from the mold support plate;
vacuum pipes each having one end connected to one of the plurality of test suction pipes;
a pump connected to the other end of the vacuum pipes; and
at least one pressure sensor configured to measure a pressure of at least one vacuum pipe from among the vacuum pipes,
wherein the paths communicate with adsorption holes formed in a top surface of the mold, wherein the at least one pressure sensor comprises a determining unit configured to determine whether an adsorption hole from among the adsorption holes is clogged by using the pressure measured, and wherein the test suction pipes communicate with the paths via suction ports formed in a bottom surface of the mold.

2. The mold test apparatus of claim 1, wherein the determining unit determines how many of the adsorption holes are clogged such that the determining unit determines that at least two of the adsorption holes are clogged.

3. The mold test apparatus of claim 1, wherein the test suction pipes communicate with the paths via suction ports formed in a bottom surface of the mold.

4. The mold test apparatus of claim 1, wherein the pump comprises a vacuum pump configured to generate a negative pressure.

5. The mold test apparatus of claim 1, wherein the mold support plate further comprises a positioning pin configured to adjust a position of the mold.

6. The mold test apparatus of claim 1, wherein the mold support plate further comprises a fixing pin configured to fix the mold.

7. The mold test apparatus of claim 1, wherein a size of each of the adsorption holes is in a range of 0.1 to 1 mm.

8. The mold test apparatus of claim 1, wherein portions of the vacuum pipes are connected to each other so that the pump communicates with at least one test suction pipe.

9. The mold test apparatus of claim 8, wherein a valve is installed at the vacuum pipes.

10. The mold test apparatus of claim 1, wherein the mold comprises an upper mold or a lower mold for molding a semiconductor package.

11. A method of testing a mold, comprising:
mounting a mold on a top surface of a mold support plate so that a plurality of test suction pipes disposed on the mold support plate are in close contact with suction ports on a lower surface of the mold, the suction ports communicating with paths in the mold;
fixing the mounted mold; and
measuring, by a pressure sensor, pressures of vacuum pipes; configured to connect the plurality of test suction pipes to a pump,
wherein the paths in the mold communicate with film adsorption holes formed in a top surface of the mold.

12. The method of claim 11, further including determining whether the film adsorption holes are clogged by using pressures of vacuum pipes measured by the pressure sensor.

13. The method of claim 12, wherein the determining comprises determining how many of the film adsorption holes are clogged by comparing pressures measured with a previously input pressure value, wherein at least two of the film adsorption holes are determined to be clogged.

14. The method of claim 11, wherein pressure measuring is performed on each of the vacuum pipes.

15. The method of claim 11, wherein the mold comprises an upper mold or a lower mold for molding a semiconductor package.

16. A mold test apparatus comprising:
a mold support plate having a top surface on which a mold is mounted, wherein the mold support plate comprises a plurality of test suction pipes communicating with paths in the mold and protruding upward from the mold support plate;
vacuum pipes each having one end connected to one of the plurality of test suction pipes;
a pump connected to the other end of the vacuum pipes; and
at least one pressure sensor configured to measure a pressure of the vacuum pipes,
wherein the mold comprises a plurality of regions having adsorption holes,
wherein the paths communicate with adsorption holes disposed in one region of the plurality of regions,
wherein the adsorption holes comprise film adsorption holes, and
wherein the test suction pipes communicate with the paths via suction ports formed in a bottom surface of the mold.

17. The mold test apparatus of claim 16, further including a determining unit configured to determine, while the mold is in a non-molding state, whether the adsorption holes are clogged by using the pressure measured by the pressure sensor.

18. The mold test apparatus of claim 17, wherein the determining unit determines how many of the adsorption holes are clogged such that the determining unit determines that at least two of the adsorption holes are clogged.

19. The mold test apparatus of claim 17, wherein the adsorption holes include substrate adsorption holes.

20. The mold test apparatus of claim 17, wherein the pump comprises a vacuum pump configured to generate a negative pressure.

* * * * *